(12) United States Patent
Sundström et al.

(10) Patent No.: US 11,251,804 B2
(45) Date of Patent: Feb. 15, 2022

(54) RECEIVER CIRCUIT FOR AN ANTENNA ARRAY SYSTEM

(71) Applicant: Telefonaktiebolaget LM Ericsson (publ), Stockholm (SE)

(72) Inventors: Lars Sundström, Södra Sandby (SE); Peter Jakobsson, Lund (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 17/257,517

(22) PCT Filed: Jul. 6, 2018

(86) PCT No.: PCT/EP2018/068424
§ 371 (c)(1),
(2) Date: Dec. 31, 2020

(87) PCT Pub. No.: WO2020/007494
PCT Pub. Date: Jan. 9, 2020

(65) Prior Publication Data
US 2021/0305992 A1 Sep. 30, 2021

(51) Int. Cl.
*H03M 1/12* (2006.01)
*H03M 1/06* (2006.01)
*H04B 7/08* (2006.01)

(52) U.S. Cl.
CPC ....... *H03M 1/1215* (2013.01); *H03M 1/0673* (2013.01); *H04B 7/0817* (2013.01)

(58) Field of Classification Search
CPC .............. H03M 1/1215; H03M 1/0673; H04B 7/0817; H04B 7/08
(Continued)

(56) References Cited

U.S. PATENT DOCUMENTS 7,233,270 B2 * 6/2007 Lin ..................... H03M 1/0604
341/118
9,294,112 B1 3/2016 Devarajan et al.
2018/0083816 A1 * 3/2018 Bolstad .............. H01Q 21/0025

FOREIGN PATENT DOCUMENTS

JP 2016131327 A 7/2016

OTHER PUBLICATIONS

Devarajan, Siddharth, et al., "A 12-b 10-GS/s Interleaved Pipeline ADC in 28-nm CMOS Technology", IEEE Journal of Solid-State Circuits, vol. 52, No. 12, Dec. 2017, 3204-3218.
(Continued)

*Primary Examiner* — Khai M Nguyen
(74) *Attorney, Agent, or Firm* — Murphy, Bilak & Homiller, PLLC

(57) ABSTRACT

A receiver circuit for an antenna array system (AAS) is disclosed. The receiver circuit (10) comprises a set of receivers ($15_1$-$15_p$). Each receiver ($15_1$-$15_p$) comprises a first TI-ADC ($35_1$) in a receive path of the receiver. The first TI-ADC ($35_1$) comprises a plurality of sub ADCs ($A_1$-$A_{M+N}$). Each receiver ($15_1$-$15_p$) comprises a control circuit (40) configured to select which sub ADC ($A_1$-$A_{M+N}$) is to operate on what input sample based on a first selection sequence. The control circuits (40) in the different receivers ($15_1$-$15_p$) in said set of receivers ($15_1$-$15_p$) are configured to use different first selection sequences.

15 Claims, 3 Drawing Sheets

(58) Field of Classification Search
USPC .......................................... 341/155; 375/316
See application file for complete search history.

(56) References Cited

OTHER PUBLICATIONS

Doris, Kostas, et al., "A 480 mW 2.6 GS/s 10b Time-Interleaved ADC With 48.5 dB SNDR up to Nyquist in 65 nm CMOS", IEEE Journal of Solid-State Circuits, vol. 46, No. 12, Dec. 2011, 2821-2833.

Jin, Huawen, et al., "Time-Interleaved A/D Converter with Channel Randomization", 1997 IEEE International Symposium on Circuits and Systems, Hong Kong, Jun. 9-12, 1997, 425-428.

Van Thillo, W., et al., "A Flexible Antenna Selection Scheme for 60 GHz Multi-Antenna Systems Using Interleaved ADCs", 2009 IEEE International Conference on Communications, Dresden, Germany, Jun. 2009, 1-5.

* cited by examiner

RECEIVER CIRCUIT FOR AN ANTENNA ARRAY SYSTEM

TECHNICAL FIELD

The present invention relates to a receiver circuit for an antenna array system, in particular to analog-to-digital conversion within such a receiver circuit.

BACKGROUND

Antenna array systems (AAS) will be a ubiquitous component in forthcoming 5G (fifth generation) wireless communication systems as a means of improving capacity at the low GHz frequencies and to ensure sufficient coverage as the operating frequency extends to the mmW range. Antenna arrays typically consists of a regular structure of antenna elements or sub-array of antenna elements, typically from 8 up to 512 depending on RF frequency and deployment scenario. The single antenna element or sub-array of antenna elements that is connected to a respective receiver and transmitter pair is from now on referred to as an element. The receiver for each element may include analog-to-digital converters (ADCs) for conversion from analog to digital domain before further processing in digital domain, where the signals from different elements are weighted and combined to form signals as received in different beams (directions), or more generally put, in different layers. Sometimes this setup is referred to as digital beamforming as opposed to analog beamforming where signals are combined in analog domain before conversion to digital domain. A mixture of the two mentioned beamforming methods are sometimes referred to as hybrid beamforming.

The 5G wireless communication standard will also introduce transmission bandwidths much larger compared with previous generations, e.g. due to larger carrier bandwidths, carrier aggregation and multi-band operation. For the data converters to accommodate these larger bandwidths, while being reasonably power efficient, so called time-interleaved ADCs (TI-ADCs) may be used. A basic TI-ADC has M sub ADCs, each converting samples at the same clock frequency $f_s$ but at different (equidistant) phases so as to effectively yield a conversion rate of $M \times f_s$ when the outputs of the sub ADCs are recombined. The sub ADCs are typically implemented as SAR (Successive Approximation Register), pipeline, or flash ADCs, or hybrids of those schemes. The time-interleaving is required as the individual sub ADCs cannot be designed to operate accurately and/or power efficient enough at the aggregated conversion rate of $M \times f_s$.

A disadvantage with TI-ADCs is the mismatch effects that appear between sub ADCs (e.g. timing skew, phase, gain, DC offset) lead to interleaving spurs and thus degraded spurious-free dynamic range (SFDR), if not mitigated.

One means of handling these mismatch effects is to introduce N additional, redundant, sub ADCs such that for each sample to convert there is two or more (N+1) sub ADCs to choose from, as opposed to one in the conventional TI-ADC. The selection is made (pseudo-) randomly to spread the errors across the entire Nyquist range and thus to improve SFDR. The total level of error power is however not reduced.

Thus, in an 5G AAS there will be an array of receivers with associated ADCs. For cost and power consumption reasons there is a push for increased integration. This means that ADCs for a large set of elements (say 8-32 elements) will be integrated into one chip and only a few of those chips will be required to support one entire AAS. The ADCs within each such chip will have quite similar characteristics and to a lesser extent between ADCs in different chips. Nevertheless, there also exists mismatch effects between ADCs on the same chip and between sub ADCs within each ADC.

SUMMARY

An object of the present invention is to suppress the impact of errors related to ADCs in an AAS.

According to a first aspect, there is provided a receiver circuit for an AAS. The receiver circuit comprises a set of receivers. Each receiver comprises a first time-interleaved TI-ADC in a receive path of the receiver. The first TI-ADC comprises a plurality of sub ADCs. Each receiver comprises a control circuit configured to select which sub ADC is to operate on what input sample based on a first selection sequence. The control circuits in the different receivers in said set of receivers are configured to use different first selection sequences.

In some embodiments, each of the first selection sequences is a random or pseudo-random sequence.

In some embodiments, the first selection sequences for the different receivers are time-shifted versions of each other.

In some embodiments, each receiver comprises a sequence generator circuit configured to generate the first sequence for that receiver, wherein the sequence generator circuits in the different receivers in said set of receivers have different circuit structures, thereby providing different first selection sequences.

In some embodiments, the control circuit of each receiver is configured to control signal chopping of the first TI-ADC in that receiver based on a second selection sequence, wherein the control circuits in the different receivers in said set of receivers are configured to use different second selection sequences.

The receivers may be quadrature receivers having an in-phase (I) receive path and a quadrature-phase (Q) receive path. Each receiver may comprise a second TI-ADC. The control circuit of each receiver may be configured to dynamically swap which of the first and second TI-ADC operates in the I receive path and which of the first and second TI-ADC operates in the Q receive path based on a third selection sequence. The control circuits in the different receivers in said set of receivers may be configured to use different third selection sequences. The receiver circuit may be configured to receive signals comprising symbols, such as OFDM symbols, separated in time by guard periods, such as the periods populated with cyclic prefixes, and the control circuits may be configured to perform said dynamic swapping during guard periods.

According to a second aspect, there is provided an AAS comprising the receiver circuit of the first aspect.

According to a third aspect, there is provided a method of operating a receiver circuit of an AAS. The receiver circuit comprises a set of receivers. Each receiver comprises a first TI-ADC in a receive path of the receiver. The first TI-ADC comprises a plurality of sub ADCs. The method comprises, in each receiver, selecting which sub ADC is to operate on what input sample based on a first selection sequence. Different first selection sequences are used in different receivers of the set of receivers.

In some embodiments, each of the first selection sequences is a random or pseudo-random sequence.

In some embodiments, the first selection sequences for the different receivers are time-shifted versions of each other.

In some embodiments, each receiver comprises a sequence generator circuit configured to generate the first sequence for that receiver, wherein the sequence generator circuits in the different receivers in said set of receivers have different circuit structures, thereby providing different first selection sequences.

In some embodiments, the method comprises, in each receiver, controlling signal chopping of the first TI-ADC in that receiver based on a second selection sequence, wherein different second selection sequences are used in different receivers of the set of receivers.

In some embodiments, the receivers are quadrature receivers having an I receive path and a Q receive path, and each receiver comprises a second TI-ADC. The method may comprise, in each receiver, dynamically swapping which of the first and second TI-ADC operates in the I receive path and which of the first and second TI-ADC operates in the Q receive path based on a third selection sequence. Different third selection sequences may be used in different receivers of the set of receivers. The receiver circuit may be configured to receive signals comprising symbols, such as OFDM symbols, separated in time by guard periods, such as the periods populated with cyclic prefixes, and said dynamic swapping may be performed during guard periods.

Further embodiments are defined in the dependent claims. It should be emphasized that the term "comprises/comprising" when used in this specification is taken to specify the presence of stated features, integers, steps, or components, but does not preclude the presence or addition of one or more other features, integers, steps, components, or groups thereof.

DETAILED DESCRIPTION

This detailed description outlines various randomization techniques for spreading spurious signal components caused by mismatch errors between ADCs in the context of an AAS. In embodiments described herein, the randomization processes occurring in different receivers of the AAS are decorrelated such that spurious signal components due to errors in the ADCs of the receivers are non-coherently combined in an overall output of the AAS, and thereby suppressed in relation to the useful information-bearing signals which are coherently combined in the overall output of the AAS.

Figure 1:
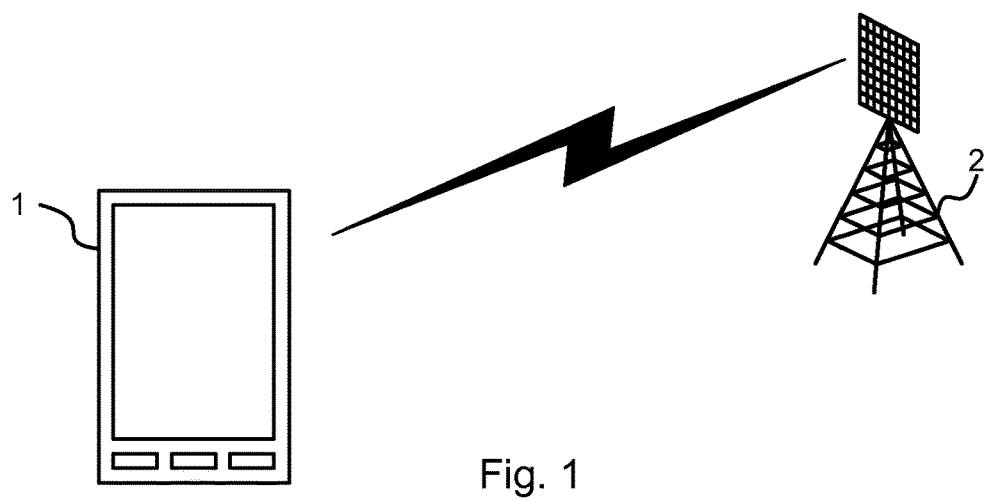
FIG. 1 illustrates a communication environment.

FIG. 1 illustrates a communication environment wherein embodiments of the present invention may be employed. A wireless communication device 1, or wireless device 1 for short, of a cellular communications system is in wireless communication with a radio base station 2 of the cellular communications system. The wireless device 1 may be what is generally referred to as a user equipment (UE). The wireless devices 1 is depicted in FIG. 1 as a mobile phone, but may be any kind of device with cellular communication capabilities, such as a tablet or laptop computer, machine-type communication (MTC) device, or similar. Furthermore, a cellular communications system is used as an example throughout this disclosure. However, embodiments of the present invention may be applicable in other types of systems as well, such as WiFi systems.

Figure 2:
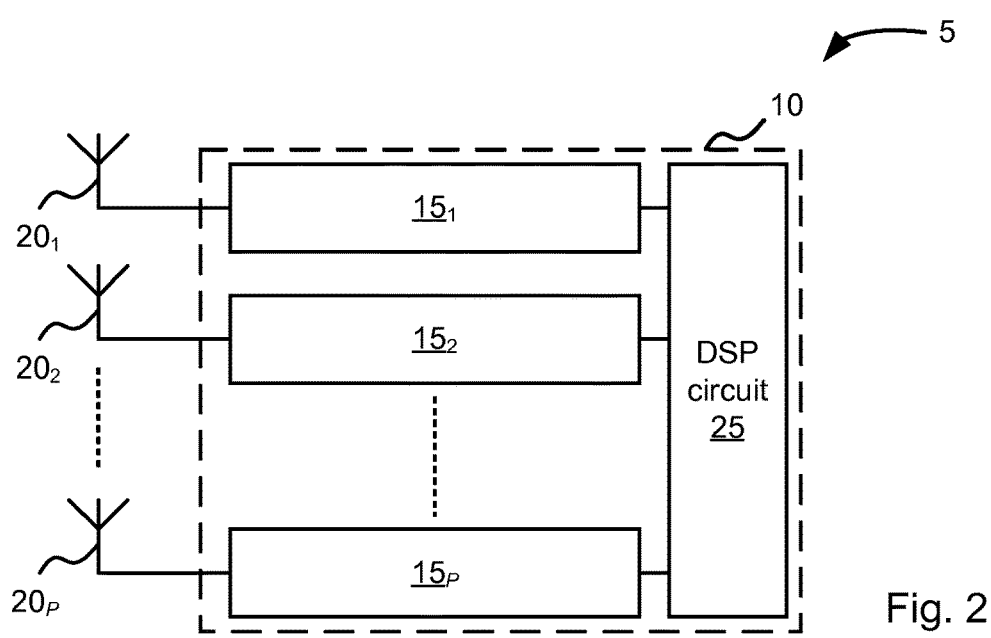
FIGS. 2-7 show block diagrams.

In some embodiments, the radio base station 2 is equipped with an antenna array system (AAS). FIG. 2 is a block diagram of such an AAS 5 according to an embodiment. FIG. 2 only considers the receive part of the AAS and therefore omits parts that relate to the transmit part for simplicity. In FIG. 2, the AAS 5 comprises a receiver circuit 10. The receiver circuit 10 comprises a set of receivers $15_1$-$15_p$. Each receiver $15_1$-$15_p$ is connected to a corresponding antenna element $20_1$-$20_p$ of the AAS 5. As illustrated in FIG. 2, the receiver circuit 10 may also comprise a digital signal processing (DSP) circuit 25 connected to outputs of the receivers $15_1$-$15_p$. The DSP circuit 25 may be configured to process the output signals from the receivers $15_1$-$15_p$, e.g. forming weighted combinations of these output signals to support beamforming reception within the AAS 5. Below, such weighted combinations are referred to as simply "combined signals". In some embodiments, the DSP circuit 25 may be omitted in the receiver circuit 25. For instance, the DSP circuit 25 may be external to the receiver circuit 10.

To facilitate the understanding of embodiments of the present invention, a simplified mathematical analysis is presented below. Let $$x_i[n]=a_i s[n]+e_i[n] \quad (1)$$

denote a discrete-time signal, where $i \in \{1, 2, \ldots, P\}$ is an index, n is a sequence index indicating a particular sample, $a_i$ is a positive real-valued coefficient, s[n] is a useful information-bearing signal, and $e_i[n]$ is an error. In the simplified analysis, the signal $x_i[n]$ represents a contribution from the receiver $15_i$ to the combined signal. In an AAS, the antenna weights are selected such that the components $a_i s[n]$ corresponding to the useful information-bearing signal from all receivers combine constructively in amplitude in the combined signal, which is the basis for setting all $a_i > 0$ in the simplified analysis. Hence, the signals $x_i[n]$ should be seen as the contribution from receiver $15_i$ after the antenna weight for that receiver has been applied. Let $$X[n] = \sum_{i=1}^{P} x_i[n] = \left(\sum_{i=1}^{P} a_i\right) s[n] + \sum_{i=1}^{P} e_i[n] = a \cdot s[n] + e[n] \quad (2)$$

denote the combined signal in the simplified analysis. As mentioned above, the components $a_i s[n]$ corresponding to the useful information-bearing signal combine constructively in amplitude. If the different error signals e [n] are mutually uncorrelated, they will not combine constructively in amplitude, but instead combine in the power domain. The overall result of this is that, in relation to the useful information-bearing signal, the errors will be suppressed in the combined signal. If, for instance, all $a_i=1$ and all e [n] have the same power, the signal-to-noise ratio (SNR) (when only considering the errors e [n] as contributing to the noise) of the combined signal X[n] will be improved with a factor P (in the linear power domain), or $10 \cdot \log_{10} P$ dB, compared with the SNRs of the individual signals $x_i[n]$. Although the above analysis is simplified, for instance in that it assumes that the components $a_i s[n]$ corresponding to the useful information-bearing signal from all receivers combine perfectly coherently and ignores errors and signal components other than the useful information-bearing signal s[n] and the uncorrelated errors e [n], it is nevertheless helpful for qualitatively understanding the embodiments described below.

Figure 3:
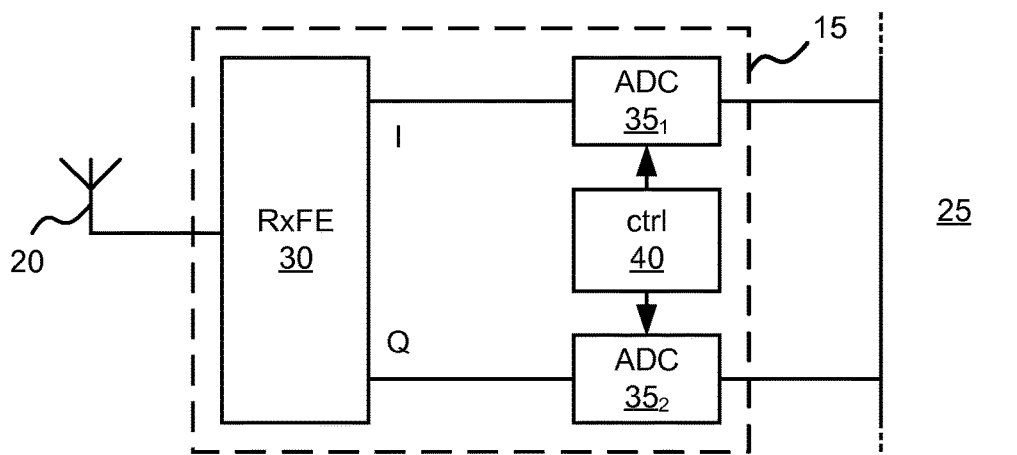

FIG. 3 is a block diagram of a receiver 15 according to an embodiment. Each receiver $15_1$-$15_p$ may be implemented as the receiver 15. For simplicity, the reference sign 15 is used, without any index, in the generic block diagrams describing any of the receivers $15_1$-$15_p$. Similarly, the reference sign 20 is used, without any index, for the corresponding antenna element in these figures.

In FIG. 3, the receiver 15 comprises a receiver frontend (RxFE) 30. The RxFE 30 may comprise circuitry configured to process the radio-frequency (RF) signal received at the antenna element 20 to a format suitable for analog-to-digital conversion. This may include operations such as frequency downconversion, filtering, and/or amplification. The RxFE 30 may comprise one or more mixers, filters, and/or amplifiers, such as low-noise amplifiers (LNAs), to perform such operations. The design of such RxFE circuitry is, per se, well known to a person skilled in the art of radio receiver circuitry and not discussed in any further detail. In FIG. 3, the receiver 15 comprises a first TI-ADC $35_1$ in a receive path of the receiver 15.

As illustrated in FIG. 3, the receiver 15 may also comprise a second TI-ADC $35_2$ in a receive path of the receiver 15. For example, the receiver 15 may be a quadrature receiver and said receive paths may be an in-phase (I) receive path and a quadrature-phase (Q) receive path. This is indicated in FIG. 3 with the letters I and Q. It should be noted though that, in some embodiments, the second TI-ADC $35_2$ may be omitted. For instance, the receiver 15 may, in some embodiments, comprise a single receive path. For example, in some embodiments, the analog-to-digital conversion may be performed on a radio-frequency (RF) signal or an intermediate-frequency (IF) signal, whereby splitting into I and Q receive paths in the analog domain can be omitted. In the former case, the RxFE circuit 30 is not configured to perform any frequency downconversion. In the latter case, the RxFE circuit 30 is configured to perform frequency downconversion to the intermediate frequency.

Furthermore, in FIG. 3, the receiver 15 comprises a control circuit 40, to be further described in the context of various embodiments.

In some embodiments, randomization of sub ADC selection order is applied.

Figure 4:
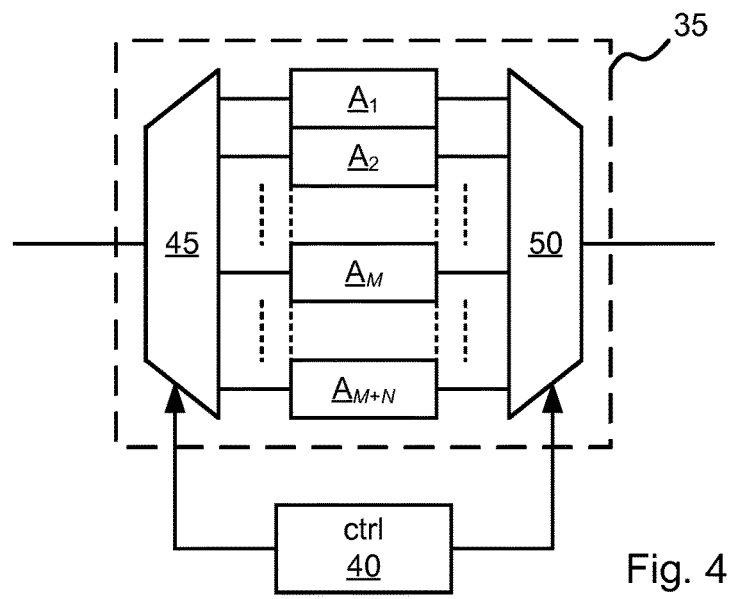

FIG. 4 is a block diagram of a TI-ADC 35. Both the first TI-ADC $35_1$ and the second TI-ADC $35_2$ may be implemented as the TI ADC 35. Thus, the reference sign 35 is used, without any index, in FIG. 4 for simplicity.

In FIG. 4, the TI-ADC 35 comprises a plurality M+N of sub ADCs $A_1$-$A_{M+N}$. The control circuit 40 is configured to select which sub ADC $A_1$-$A_{M+N}$ is to operate on what input sample based on a first selection sequence. As an illustrative example, the embodiment of the TI-ADC 35 illustrated in FIG. 4 comprises an analog demultiplexer 45 to distribute the current input sample to the currently selected sub ADC $A_i$, and a digital multiplexer 50 to interleave the digital output samples from the sub ADCs $A_i$ to a digital output signal of the TI-ADC 35, under control of the control unit 40.

The first selection sequence may, for instance, be a random or pseudo-random sequence. For instance, the TI-ADC may operate as follows. During operation, M of the sub ADCs $A_i$ are simultaneously operated for converting M respective consecutive input signal samples of the TI-ADC from an analog to a digital representation. Let us label these M sub ADCs $A_i$ "active". Consequently, there are N idle sub ADCs. For the next input sample, there are N+1 sub ADCs $A_i$ available that could be selected by the control unit for converting that input sample to an analog representation, namely the N idle sub ADCs $A_i$ and one of the active sub ADCs $A_i$ that will be ready with its previous sample just in time to handle the next sample. The control unit 40 may perform the selection of which one of the N+1 available sub ADCs $A_i$ based on the first selection sequence. For instance, the indices of the N+1 available sub ADC may be stored in a table that in turn is addressed by a random or pseudo random number generator to select the sub ADC to be used for the next sample. A pseudo number generator may be implemented by means of a maximum length linear-feedback shift register (LFSR) from which b bits are collected for each sub ADC selection to generate a pseudo random table address $[0, 1, \ldots, 2^b-1]$. Alternatively, b parallel LFSRs could be used to form an address with each LFSR generating a respective bit of the address. Each one of the b parallel LFSRs may be implemented differently with regards to the feedback coefficients and the sequence length. Alternatively, a reconfigurable LFSR maybe used where at least one of length and feedback coefficients can reconfigured.

As mentioned in the background, this spreads the errors across the entire Nyquist range and improves SFDR, but the total level of error power of the TI-ADC 35 is not reduced. However, in the context of AAS receivers, the inventors have realized that if different first selection sequences are used in the different receivers $15_1$-$15_p$, the errors will be uncorrelated between the different receivers $15_1$-$15_p$. As discussed in the simplified mathematical analysis above, the useful information-bearing received signals received at the different antenna elements are combined constructively in amplitude in the combined output signal generated in the DSP circuit 25, whereas the uncorrelated errors from the TI-ADCs 35 in the different receivers $15_1$-$15_p$ are only combined in power. Hence, in relation to the useful information-bearing received signal, the uncorrelated errors from the TI-ADCs 35 in the receivers $15_1$-$15_p$ will be suppressed in the combined output signal generated in the DSP circuit 25. In contrast, if the same first selection sequence were to be used in all receivers $15_1$-$15_p$, then every sub ADC $A_i$ in one TI-ADC 35 is always selected in combination with the same set of sub ADCs $A_i$ from the other TI-ADCs 35. In that case, the errors from TI-ADCs 35 in the receivers $15_1$-$15_p$ are correlated, and will not be suppressed in the manner described above. Therefore, according to embodiments of the present invention, the control circuits 40 in the different receivers $15_1$-$15_p$ in said set of receivers $15_1$-$15_p$ are configured to use different first selection sequences.

There are different ways of obtaining different first selection sequences in the different receivers. In some embodiments, the first selection sequences for the different receivers $15_1$-$15_p$ are time-shifted versions of each other. In these embodiments, there may be a common sequence generator circuit (not shown) that generates a selection sequence, which is distributed to the different receivers $15_1$-$15_p$ with different delays. Alternatively, the receivers $15_1$-$15_p$ may comprise identical sequence generator circuits that are started up in different states, wherein the different states correspond to the desired delays.

Figure 5:
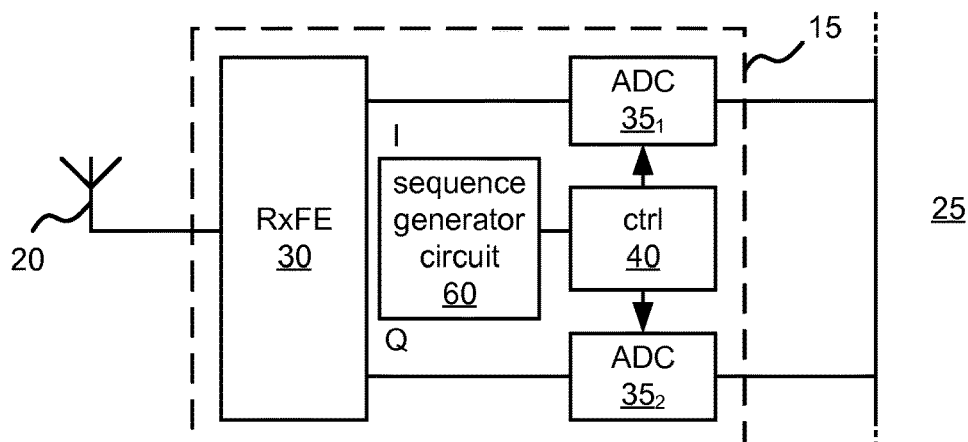

In other embodiments, each receiver $15_1$-$15_p$ comprises a sequence generator circuit 60, as configured to generate the first sequence for that receiver $15_1$-$15_p$, as illustrated in FIG. 5. The sequence generator circuits 60 in the different receivers $15_1$-$15_p$ in said set of receivers $15_1$-$15_p$ may have different circuit structures, thereby providing different first selection sequences. For instance, the sequence generator circuits 60 in the different receivers $15_1$-$15_p$ may be implemented with LFSRs with different lengths and/or feedback coefficients, thereby providing different first selection sequences.

According to some embodiments, randomization in the form of so called chopping may be applied to the first TI ADC $35_1$ and/or the second TI ADC $35_2$. Chopping means that the polarity of the input signal of the TI ADC is swapped repeatedly. A corresponding polarity swapping is performed in the digital domain on the output signal from the TI ADC to compensate for the polarity swapping of the input signal. According to some embodiments, the control circuit 40 of each receiver $15_1$-$15_p$ is configured to control signal chopping of the first TI-ADC $35_1$ (and/or the second TI ADC $35_2$) in that receiver based on a second selection sequence. As for the first selection sequence, the second selection sequence may, for instance, be a random or pseudo-random sequence. For instance, the second selection sequence may be a binary sequence, where samples can adopt the value '0' or the value '1'. The chopping may e.g. be applied by letting the input signal to the TI ADC have one polarity when the current sample of the second selection sequence has the value '0', and the opposite polarity when the current sample of the second selection sequence has the value '1'. An effect of the chopping is that interleaving spurious signal components due to DC offset errors are spread out in frequency.

Figure 6:
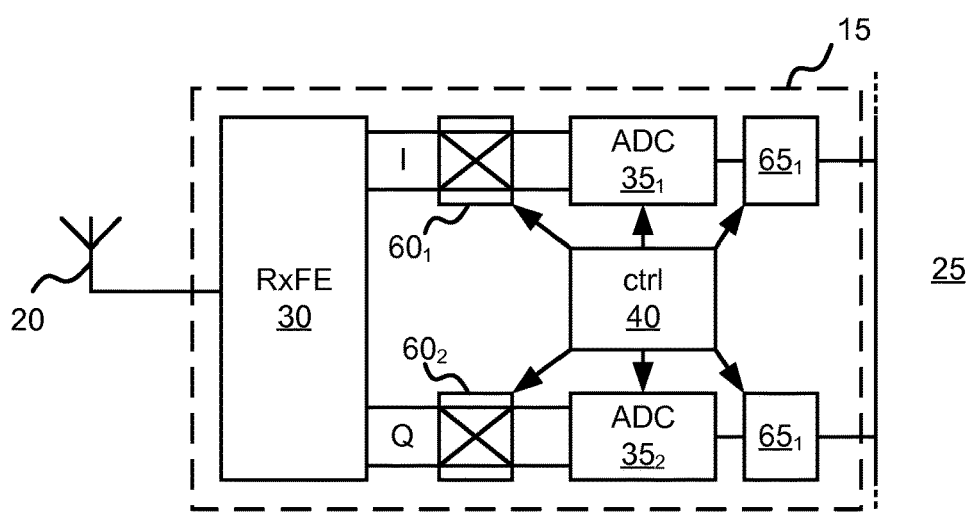

FIG. 6 is an example of a block diagram where chopping is applied to both the first and the second TI ADC $35_1$, $35_2$. The signals output in the I and the Q receive paths from the RxFE 30 are differential signals. The swapping of polarity is performed by polarity-swapping circuits $60_1$ (in the I receive path) and $60_2$ (in the Q receive path) under control of the control circuit 40. For instance, the polarity-swapping circuit $60_1$ may be configured to transfer a first output component of the differential I signal from the RxFE 30 to a first input terminal of the first TI ADC $35_1$ when the current sample of the second selection sequence has the value '0', and to a second input terminal of the first TI ADC $35_1$ when the current sample of the second selection sequence has the value '1'. Furthermore, the polarity-swapping circuit $60_1$ may be configured to transfer a second output component of the differential I signal from the RxFE 30 to the second input terminal of the first TI ADC $35_1$ when the current sample of the second selection sequence has the value '0', and to the first input terminal of the first TI ADC $35_1$ when the current sample of the second selection sequence has the value '1'. Similarly, the polarity-swapping circuit $60_2$ may be configured to transfer a first output component of the differential Q signal from the RxFE 30 to a first input terminal of the second TI ADC $35_2$ when the current sample of the second selection sequence has the value '0', and to a second input terminal of the second TI ADC $35_1$ when the current sample of the second selection sequence has the value '1'. Furthermore, the polarity-swapping circuit $60_1$ may be configured to transfer a second output component of the differential Q signal from the RxFE 30 to the second input terminal of the second TI ADC $35_1$ when the current sample of the second selection sequence has the value '0', and to the first input terminal of the first TI ADC $35_1$ when the current sample of the second selection sequence has the value '1'. In some embodiments, each sample of the second selection sequence is a tuple having separate binary components for controlling the chopping of the first and second TI ADCs $35_1$ and $35_2$.

In FIG. 6, polarity compensation circuits $65_1$ and $65_2$ are connected to the outputs of the first and second TI ADC $35_1$, $35_2$, respectively, to compensate, in the digital domain, for the polarity swapping performed by the polarity-swapping circuits $60_1$, $60_2$. If, for instance, a signed representation is used for the digital signals output from the TI ADCs $35_1$ and $35_2$, such compensation can be performed by simply multiplying the output signal samples with +1 or −1, depending on whether the polarity of the input sample was swapped or not. In some embodiments, the polarity compensation circuits $65_1$ and $65_2$ may be omitted. For instance, the polarity swapping compensation may be performed in the DSP circuit 25 instead.

In a similar manner as for the first selection sequence, the inventors have realized that if different second selection sequences are used in the different receivers $15_1$-$15_p$, the errors affected by the chopping will be uncorrelated between the different receivers $15_1$-$15_p$. In a similar way as described above in the context of randomization of sub ADC selection order, and in the simplified mathematical analysis, these uncorrelated errors will be suppressed in relation to the useful information-bearing received signal in the combined output signal generated in the DSP circuit 25. Hence, in some embodiments, the control circuits 40 in the different receivers $15_1$-$15_p$ in said set of receivers $15_1$-$15_p$ are configured to use different second selection sequences.

As for the first selection sequences, there are different ways of obtaining different second selection sequences in the different receivers. In some embodiments, the second selection sequences for the different receivers $15_1$-$15_p$ are time-shifted versions of each other. In these embodiments, there may be a common sequence generator circuit (not shown) that generates a selection sequence, which is distributed to the different receivers $15_1$-$15_p$ with different delays. Alternatively, the receivers $15_1$-$15_p$ may comprise identical sequence generator circuits that are started up in different states, wherein the different states correspond to the desired delays.

In other embodiments, each receiver $15_1$-$15_p$ comprises a sequence generator circuit, such as the sequence generator circuit 60 (FIG. 5), configured to generate the second selection sequence for that receiver $15_1$-$15_p$. The sequence generator circuits 60 in the different receivers $15_1$-$15_p$ in said set of receivers $15_1$-$15_p$ may have different circuit structures, thereby providing different second selection sequences. For instance, as for the first selection sequences, the sequence generator circuits 60 in the different receivers $15_1$-$15_p$ may be implemented with LFSRs with different lengths and/or feedback coefficients, thereby providing different second selection sequences.

It should be noted that while FIG. 6 illustrates both an I and a Q receive path, the receiver 15 may, in some embodiments, comprise a single receive path as discussed above, e.g. if the analog-to-digital conversion is performed on an RF signal or an IF signal.

In some embodiments, randomization in the form of receive path swapping may be applied. In such embodiments, the control circuit 40 of each receiver $15_1$-$15_p$ is configured to dynamically swap which of the first and second TI-ADC $35_1$, $35_2$ operates in the I receive path and which of the first and second TI-ADC $35_1$, $35_2$ operates in the Q receive path based on a third selection sequence.

As for the first and second selection sequences, the third selection sequence may, for instance, be a random or pseudo-random sequence. For instance, the third selection sequence may be a binary sequence, where samples can adopt the value '0' or the value '1'. The receive-path swapping may e.g. be applied by letting the first TI ADC $35_1$ operate in the I receive path and the second TI ADC $35_2$ operate in the Q receive path when the current sample of the third selection sequence has the value '0', and letting the first TI ADC $35_1$ operate in the Q receive path and the second TI ADC $35_2$ operate in the I receive path when the current sample of the third selection sequence has the value '1'. the opposite polarity when the current sample of the second selection sequence has the value '0. An effect of the swapping is that spurious signal components due to offset errors, gain errors, and timing skew errors between sub ADCs, as well as overall gain mismatches between the TI ADCs $35_1$ and $35_2$, are spread out in frequency.

Figure 7:
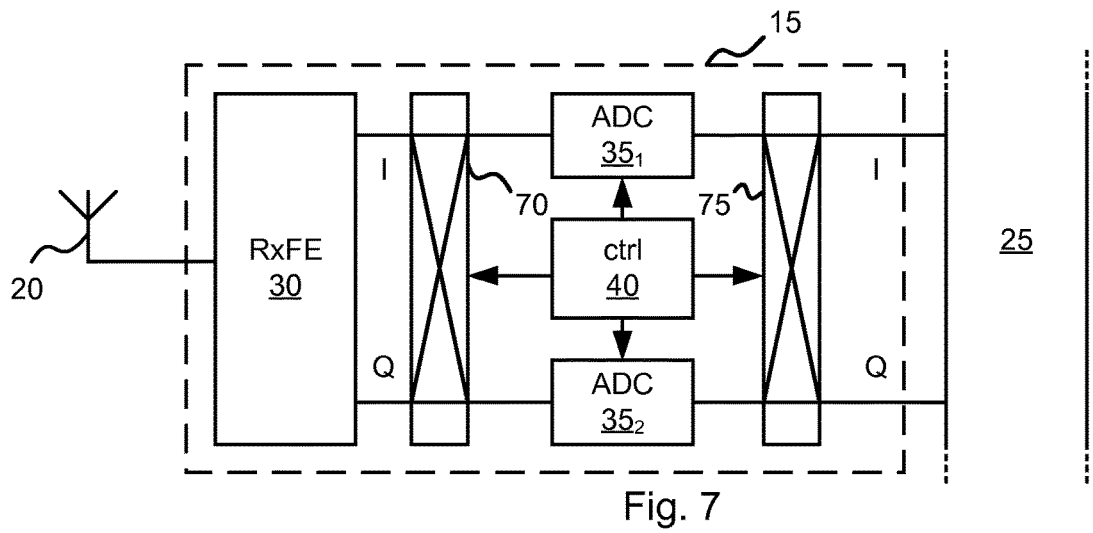

FIG. 7 is an example block diagram where such receive-path swapping is applied. In FIG. 7, the receiver 15 comprises a receive-path swapping circuit 70. The receive-path swapping circuit 70 is configured to transfer the I signal output from the RxFE circuit 30 to one of the first TI ADC $35_1$ and the second TI ADC $35_2$, and to transfer Q signal output from the RxFE circuit 30 to the other one of the first TI ADC $35_1$ and the second TI ADC $35_2$, depending on the current sample value of the third selection sequence.

As illustrated in FIG. 7, the receiver 15 may comprise a receive-path swapping compensation circuit 75 configured to operate under control of the control circuit to forward output samples from the TI ADCs $35_1$ and $35_2$ that emanate from the I receive path to an I output of the receiver 15, and to forward output samples from the TI ADCs $35_1$ and $35_2$ that emanate from the Q receive path to a Q output of the receiver 15.

In some embodiments, the receive-path swapping compensation circuit 75 may be omitted. For instance, the receive-path swapping compensation may be performed in the DSP circuit 25 instead.

In a similar manner as for the first and second selection sequences, the inventors have realized that if different third selection sequences are used in the different receivers $15_1$-$15_p$, the errors affected by the receive-path swapping will be uncorrelated between the different receivers $15_1$-$15_p$. Again, in a similar way as described above in the context of randomization of sub ADC selection order, and in the simplified mathematical analysis, these uncorrelated errors will be suppressed in relation to the useful information-bearing received signal in the combined output signal generated in the DSP circuit 25. Hence, in some embodiments, the control circuits 40 in the different receivers $15_1$-$15_p$ in said set of receivers $15_1$-$15_p$ are configured to use different third selection sequences.

As for the first and second selection sequences, there are different ways of obtaining different third selection sequences in the different receivers. In some embodiments, the third selection sequences for the different receivers $15_1$-$15_p$ are time-shifted versions of each other. In these embodiments, there may be a common sequence generator circuit (not shown) that generates a selection sequence, which is distributed to the different receivers $15_1$-$15_p$ with different delays. Alternatively, the receivers $15_1$-$15_p$ may comprise identical sequence generator circuits that are started up in different states, wherein the different states correspond to the desired delays.

In other embodiments, each receiver $15_1$-$15_p$ comprises a sequence generator circuit, such as the sequence generator circuit 60 (FIG. 5), configured to generate the third selection sequence for that receiver $15_1$-$15_p$. The sequence generator circuits 60 in the different receivers $15_1$-$15_p$ in said set of receivers $15_1$-$15_p$ may have different circuit structures, thereby providing different third selection sequences. For instance, as for the first selection sequences, the sequence generator circuits 60 in the different receivers $15_1$-$15_p$ may be implemented with LFSRs with different lengths and/or feedback coefficients, thereby providing different third selection sequences.

Figure 8:
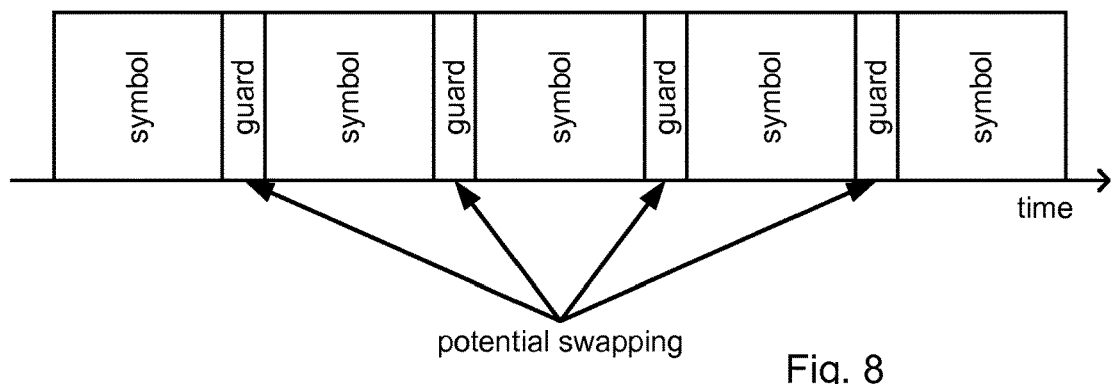
FIG. 8 shows a time diagram showing symbols separated by guard periods.

In some embodiments, the receiver circuit 10 is configured to receive signals comprising symbols separated in time by guard periods. For instance, the symbols may be orthogonal frequency division multiplexing (OFDM) symbols, and the guard periods may be the period populated with the cyclic prefixes. In some of these embodiments, the control circuits 40 may be configured to perform said dynamic swapping during guard periods. In other words, in such embodiments, each sample of the third selection sequence is valid for the duration of a whole symbol. This is illustrated in FIG. 8 with a time diagram showing the symbols separated by guard periods (which in some systems are populated with the so called cyclic prefix), and an indication that receive path swapping may potentially occur during the guard periods. It should be noted that, in order for the decorrelation to have effect in this case, a duration of several symbols is needed, in contrast to if the sample rate of the third selection sequence would be the same as the sample rate of the TI ADCs $35_1$, $35_2$, in which case the decorrelation is effective over shorter durations. An advantage of performing the dynamic swapping during guard periods is that any glitches caused by the swapping in the receive paths, that would deteriorate the received signal quality if the swapping were performed during symbol reception, will have little or no impact on the received signal quality.

In some embodiments, the receive-path swappings may be synchronized with updates of antenna weights of the AAS.

Figure 9:
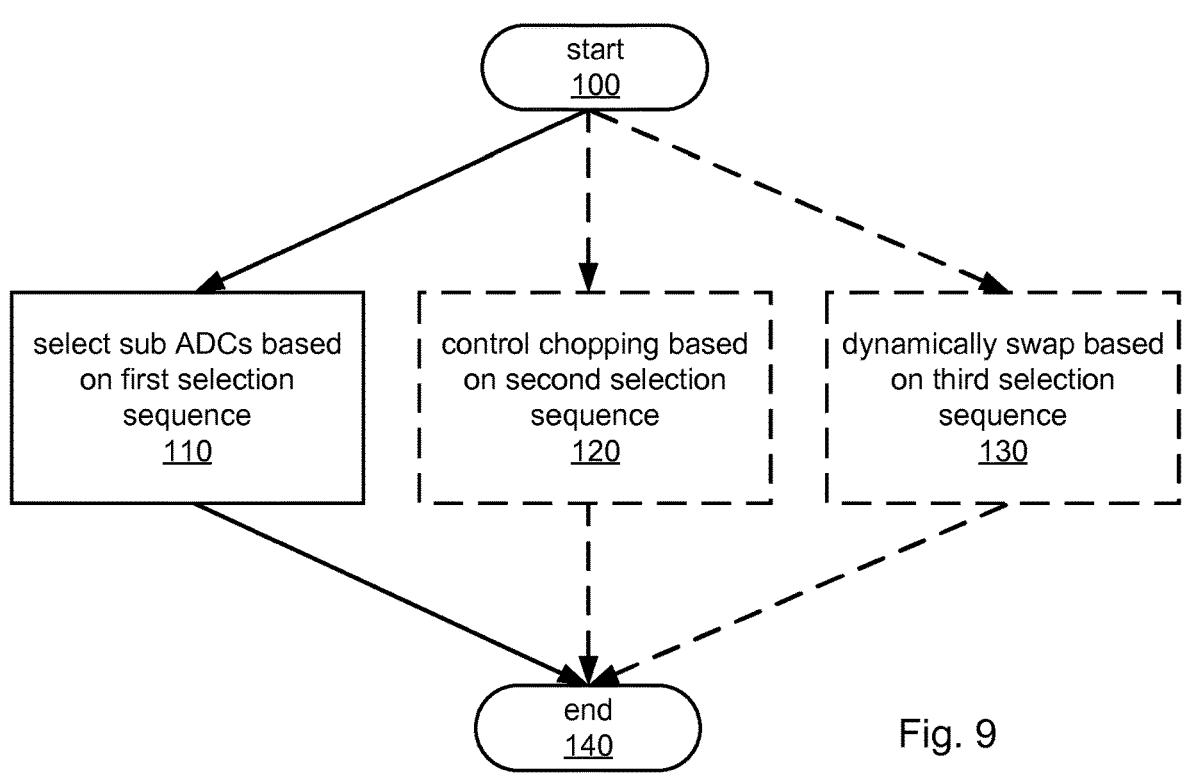
FIG. 9 is a flowchart illustrating embodiments of a method.

According to some embodiments, there is provided a method of operating the receiver circuit 10. Details of such embodiments are derivable directly from the description of the operation of the receiver circuit 10 given in the context of embodiments of the receiver circuit 10 and such details are therefore not repeated below. FIG. 8 is a simplified flowchart for such a method. In FIG. 9, operation is started in step 100. Step 100 may e.g. correspond to when the receiver circuit 10 is powered up or woken up from a sleep mode, or similar. Embodiments of the method comprises in each receiver $15_1$-$15_p$, selecting (in step 110) which sub ADC $A_1$-$A_{M+N}$ is to operate on what input sample based on the first selection sequence. As described above, different first selection sequences are used in different receivers $15_1$-$15_p$ of the set of receivers $15_1$-$15_p$.

As illustrated in FIG. 9, the method may optionally comprise, in each receiver $15_1$-$15_p$, controlling (in step 120) signal chopping of the first and/or second TI-ADC $35_1$, $35_2$ in that receiver $15_1$-$15_p$ based on the second selection sequence. As described above, different second selection sequences are used in different receivers $15_1$-$15_p$ of the set of receivers $15_1$-$15_p$.

Furthermore, as illustrated in FIG. 9, the method may optionally comprise, in each receiver $15_1$-$15_p$, dynamically swapping (in step 130) which of the first and second TI-ADC $35_1$, $35_2$ operates in the I receive path and which of the first and second TI-ADC $35_1$, $35_2$ operates in the Q receive path based on the third selection sequence. As described above, different third selection sequences are used in different receivers $15_1$-$15_p$ of the set of receivers $15_1$-$15_p$. Furthermore, in some embodiments, said dynamic swapping is performed during guard periods, as described above.

In the flowchart in FIG. 9, operation is ended in step 140. Step 140 may e.g. correspond to when the receiver circuit 10 is powered down or put into a sleep mode, or similar.

The disclosure above refers to specific embodiments. However, other embodiments than the above described are possible within the scope of the invention. Different method steps than those described above, performing the method by hardware or software, may be provided within the scope of the invention. The different features and steps of the embodiments may be combined in other combinations than those described.

The invention claimed is:

1. A receiver circuit for an antenna array system (AAS), the receiver circuit comprising a set of receivers, each receiver comprising
   a first time-interleaved (TI) analog-to-digital converter (ADC) in a receive path of the receiver, the first TI ADC comprising a plurality of sub-ADCs; and
   a control circuit configured to select which sub-ADC is to operate on what input sample based on a first selection sequence; wherein
   the control circuits in the different receivers in said set of receivers are configured to use different first selection sequences.

2. The receiver circuit of claim 1, wherein each of the first selection sequences is a random or pseudo-random sequence.

3. The receiver circuit of claim 1, wherein the first selection sequences for the different receivers are time-shifted versions of each other.

4. The receiver circuit of claim 1, wherein each receiver comprises a sequence generator circuit configured to generate the first sequence for that receiver, wherein the sequence generator circuits in the different receivers in said set of receivers have different circuit structures, thereby providing different first selection sequences.

5. The receiver circuit of claim 1, wherein the control circuit of each receiver is configured to control signal chopping of the first TI ADC in that receiver based on a second selection sequence, wherein the control circuits in the different receivers in said set of receivers are configured to use different second selection sequences.

6. The receiver circuit of claim 1, wherein the receivers are quadrature receivers having an in-phase (I) receive path and a quadrature-phase (Q) receive path, and wherein each receiver comprises:
   a second TI ADC; wherein
   the control circuit of each receiver is configured to dynamically swap which of the first and second TI ADC operates in the I receive path and which of the first and second TI ADC operates in the Q receive path based on a third selection sequence; and
   the control circuits in the different receivers in said set of receivers are configured to use different third selection sequences.

7. The receiver circuit of claim 6, wherein the receiver circuit is configured to receive signals comprising symbols separated in time by guard periods, wherein the control circuits are configured to perform said dynamic swapping during guard periods.

8. An antenna array system (AAS) comprising the receiver circuit of claim 1.

9. A method of operating a receiver circuit of an antenna array system (AAS), the receiver circuit comprising a set of receivers, each receiver comprising a first time-interleaved (TI) analog-to-digital converter (ADC) in a receive path of the receiver, the first TI ADC comprising a plurality of sub-ADCs, and the method comprising:
   in each receiver, selecting which sub-ADC is to operate on what input sample based on a first selection sequence; wherein
   different first selection sequences are used in different receivers of the set of receivers.

10. The method of claim 9, wherein each of the first selection sequences is a random or pseudo-random sequence.

11. The method of claim 9, wherein the first selection sequences for the different receivers are time-shifted versions of each other.

12. The method circuit of claim 9, wherein each receiver comprises a sequence generator circuit configured to generate the first sequence for that receiver, wherein the sequence generator circuits in the different receivers in said set of receivers have different circuit structures, thereby providing different first selection sequences.

13. The method of claim 9, comprising
   in each receiver, controlling signal chopping of the first TI ADC in that receiver based on a second selection sequence; wherein
   different second selection sequences are used in different receivers of the set of receivers.

14. The method of claim 9, wherein the receivers are quadrature receivers having an in-phase (I) receive path and a quadrature-phase (Q) receive path, wherein each receiver comprises a second TI ADC, and wherein the method comprises:
   in each receiver, dynamically swapping which of the first and second TI ADC operates in the I receive path and which of the first and second TI ADC operates in the Q receive path based on a third selection sequence; and
   different third selection sequences are used in different receivers of the set of receivers.

15. The method of claim 14, wherein the receiver circuit is configured to receive signals comprising symbols separated in time by guard periods, and wherein said dynamic swapping is performed during guard periods.

* * * * *